United States Patent [19]

Sugahara

[11] Patent Number: 5,693,980
[45] Date of Patent: Dec. 2, 1997

[54] BALL-GRID-ARRAY-TYPE SEMICONDUCTOR DEVICE

[75] Inventor: Kenji Sugahara, Tokyo, Japan

[73] Assignee: NEC Corporation, Tokyo, Japan

[21] Appl. No.: 665,536

[22] Filed: Jun. 18, 1996

[30] Foreign Application Priority Data

Jul. 6, 1995 [JP] Japan .................. 7-192671

[51] Int. Cl.⁶ .................................................. H01L 23/10
[52] U.S. Cl. .................... 257/706; 257/707; 257/737
[58] Field of Search ............................... 257/706, 707, 257/724, 778, 737

[56] References Cited

U.S. PATENT DOCUMENTS 5,572,405  11/1996  Wilson et al. ........................ 257/724

Primary Examiner—Tom Thomas
Assistant Examiner—Roy Potter
Attorney, Agent, or Firm—Whitham, Curtis, Whitham & McGinn

[57] ABSTRACT

A ball-grid-array-type semiconductor device has upper signal interconnections (1a) and a semiconductor element mounting pad (4) disposed on an upper surface of a glass epoxy substrate (7), and four extension patterns (5) extending from the semiconductor element mounting pad (4) to respective four corners of the glass epoxy substrate (7). The upper signal interconnections (1a) are connected by via-holes (2) to lower signal interconnections (1b) disposed on a lower surface of the glass epoxy substrate (7). A semiconductor element (10) is mounted on the semiconductor element mounting pad (4) and has electrodes (3) connected to the upper signal interconnections (10) by thin metal wires (11). The semiconductor element (10) mounted on the semiconductor element mounting pad (4) is sealed by a molding resin layer (9). Solder balls (3) are fused to the lower surface of the glass epoxy substrate (7) and connected to the lower signal interconnections (1b). The extension patterns (5) connected to the semiconductor element mounting pad (4) provides an increased heat radiation capability to dissipate heat generated by the semiconductor element (10). When the ball-grid-array-type semiconductor device is mounted on a circuit substrate (7), humidity absorbed therein is discharged along the extension patterns (5), thereby preventing the glass epoxy substrate (7) and the molding resin layer (9) from being peeled off each other.

20 Claims, 3 Drawing Sheets

BALL-GRID-ARRAY-TYPE SEMICONDUCTOR DEVICE

BACKGROUND OF THE INVENTION

1. Field of the Invention

The present invention relates to a semiconductor device having a ball-grid-array-type (BGA) package.

2. Description of the Related Art

As the degree of integration of integrated semiconductor elements increases, integrated circuit packages for mounting semiconductor elements have more and more pins. One proposal for conventional QFPs (Quad Flat Packages) to have an increased number of pins has been to reduce an external lead-to-lead pitch or spacing from 0.65 mm to 0.5 mm or 0.4 mm. However, the present packaging accuracy of semiconductor devices limits the practical achievement to a minimum external lead-to-lead pitch of 4 mm. QFPs with an array of external leads disposed along their outer peripheral edges are limited to at most 400 pins because of the arrayed pin arrangement and the outer package profile, while there have been growing demands for semiconductor element packages having 500 to 1000 pins to meet requirements for highly integrated configurations and multiple functions of semiconductor elements.

In recent years, one integrated-circuit package type that has been proposed to cope with the trend toward use of multiple pins is a ball-grid-array-type (BGA) package which has external leads arranged in a plane.

FIG. 1 of the appended drawings is a cross section showing a conventional semiconductor device having such a ball-grid-array-type package. As shown in FIG. 1, a glass epoxy substrate 7 supports on an upper surface thereof an upper signal interconnection pattern 1a and a semiconductor element mounting pad 4, and also supports on a lower surface thereof a lower signal interconnection pattern 1b. The upper and lower signal interconnection patterns 1a, 1b are connected to each other with via-holes 2. In the lower signal interconnection pattern 1b, there is a grid-like pattern of solder balls electrodes 3 serving as external leads. The upper signal interconnection pattern 1a is covered with a solder resist layer 6, except connecting areas thereof.

A semiconductor element 10 is mounted on the semiconductor element mounting pad 4 by a mount member (not shown). The semiconductor element 10 has electrodes connected to the upper signal interconnection pattern 1a by thin metal wires 11. The semiconductor element 10 and the thin metal wires 11 are sealed by a molding resin layer 9 according to the transfer molding process.

With the illustrated ball-grid-array-type package, the overall lower surface of the glass epoxy substrate 7 is available as an area for connection to external circuits. Therefore, the ball-grid-array-type package can have more pins than the conventional QFPs, without a smaller external lead-to-lead pitch.

Ball-grid-array-type packages are liable to absorb moisture along the interface between the glass epoxy substrate and the molding resin layer. Therefore, as such a ball-grid-array-type package is heated when it is mounted on a circuit substrate, the absorbed moisture is evaporated, tending to peel the glass epoxy substrate and the molding resin layer off each other. Consequently, it is necessary to bake the ball-grid-array-type package to remove any moisture absorbed therein before it is mounted on a circuit substrate. Furthermore, the installation of the ball-grid-array-type package on the circuit substrate has to be completed within a given period of time after the baking process. This imposes a certain difficulty on the process management scheme for installing the ball-grid-array-type package.

Another drawback is that the heat conductivity of the glass epoxy substrate is so low that the thermal resistance of the ball-grid-array-type package is higher than conventional cavity-down ceramic pin-grid-array-type (PGA) packages which have widely been used as multiple-pin packages, and that the number of mountable semiconductor elements is limited by standpoint of power consumption.

SUMMARY OF THE INVENTION

It is therefore an object of the present invention to provide a semiconductor device having a ball-grid-array-type package which can be mounted on a circuit substrate without a baking process, or with a relatively simple baking process, which has been hitherto a necessary process before installation of the device.

Another object of the present invention is to provide a semiconductor device having a ball-grid-array-type package which has an increased heat radiation capability in order to allow a semiconductor element with a large current requirement to be mounted on the ball-grid-array-type package.

To achieve the above objects, there is provided a ball-grid-array-type semiconductor device comprising an insulating substrate having a semiconductor element mounting pad on a upper surface thereof, a semiconductor element mounted on the semiconductor element mounting pad and having a plurality of electrodes, upper signal interconnections disposed on the upper surface of the insulating substrate and connected to the electrodes of the semiconductor element by thin metal wires, lower signal interconnections disposed on a lower surface of the insulating substrate which is opposite to the upper surface, lower signal interconnections disposed on the lower surface and connected to the upper signal interconnections with via-holes defined in the insulating substrate, a plurality of balls connected to the lower signal interconnections, a molding resin layer sealing the semiconductor element, and a plurality of extension patterns disposed on the upper surface and extending from the semiconductor element mounting pad out of the molding resin layer.

The above and other objects, features, and advantages of the present invention will become apparent from the following description based on the accompanying drawings which illustrate an example of the present invention.

DETAILED DESCRIPTION OF THE PREFERRED EMBODIMENTS

Figure 1:
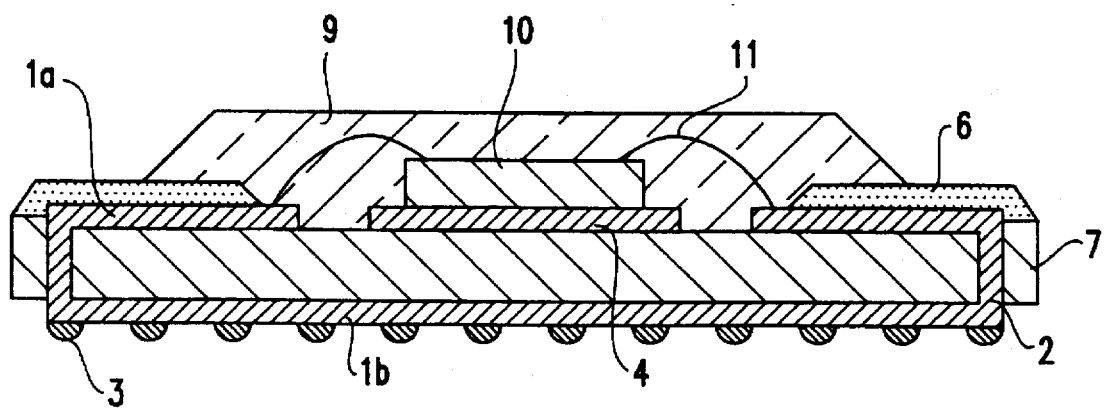
FIG. 1 is a cross-sectional view of a conventional semiconductor device having such a ball-grid-array-type package.
Figure 2:
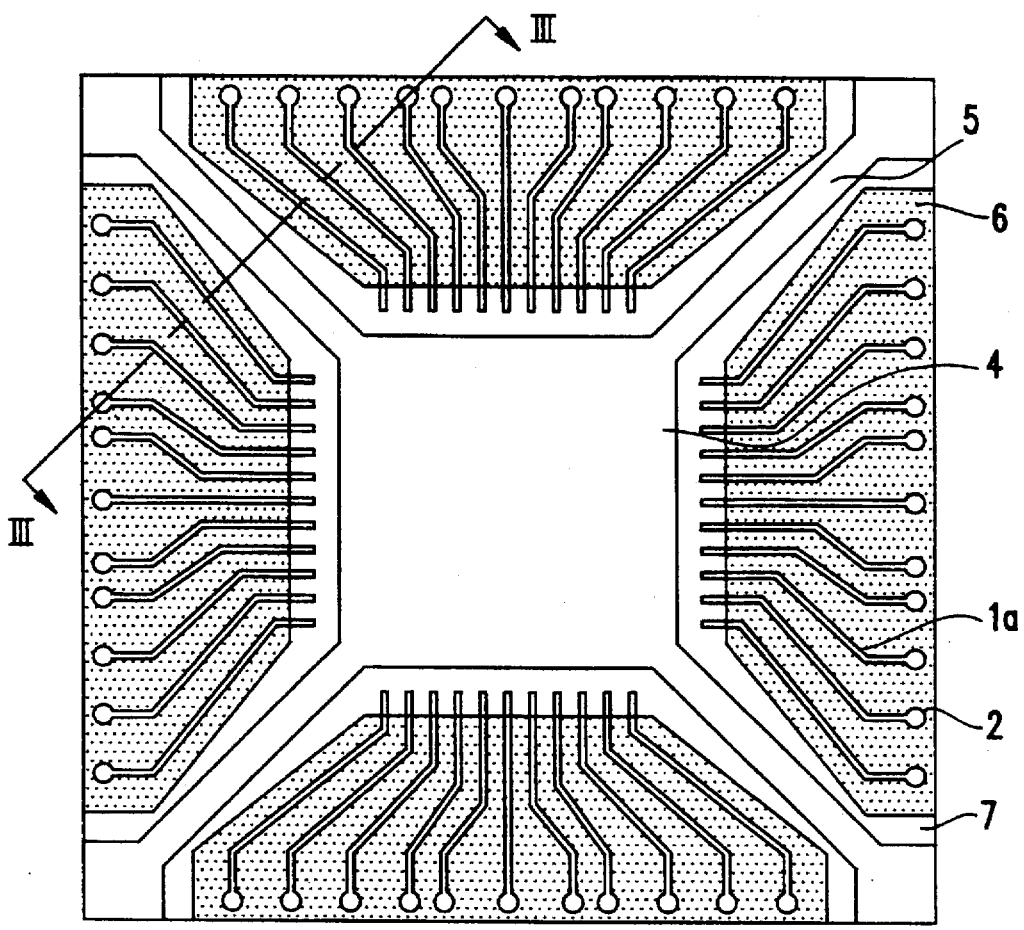
FIG. 2 is a plan view of a wiring substrate for use in an embodiment of a semiconductor device having a ball-grid-array-type package according to the present invention.

As shown in FIG. 2, the wiring substrate includes a square glass epoxy substrate 7 having in its central upper surface area a square semiconductor element mounting pad 4 in the form of a copper foil pattern which is equal or greater in size than a semiconductor element to be mounted thereon. Four extension patterns 5 in the form of a copper foil pattern disposed on an upper surface of the glass epoxy substrate 7 extend diagonally outwardly from the respective four corners of the semiconductor element mounting pad 4 toward the respective four corners of the glass epoxy substrate 7.

Figure 3:
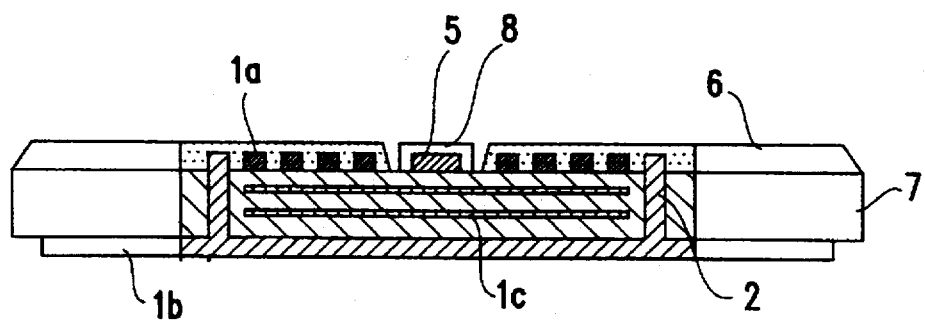
FIG. 3 is a cross-sectional view taken along line III—III of FIG. 2.

Upper signal interconnections 1a in the form of a copper foil pattern disposed on the upper surface of the glass epoxy substrate 7 extend radially outwardly from regions around the semiconductor element mounting pad 4 toward peripheral edges of the glass epoxy substrate 7. As shown in FIG. 3, the upper signal interconnections 1a are connected with via-holes 2 defined in the glass epoxy substrate 7 to lower signal interconnections 1b in the form of a copper foil pattern disposed on a lower surface of the glass epoxy substrate 7 and inner signal interconnections 1c within the glass epoxy substrate 7. The upper signal interconnections 1a and the lower signal interconnections 1b are covered with respective solder resist layers 6 except connecting areas thereof. The solder resist layer 6 which covers the lower signal interconnections 1b is omitted from illustration. Each of the extension patterns 5 is plated with a gold layer 8, and is not covered with any solder resist layer 6, different from the signal interconnection.

Figure 4:
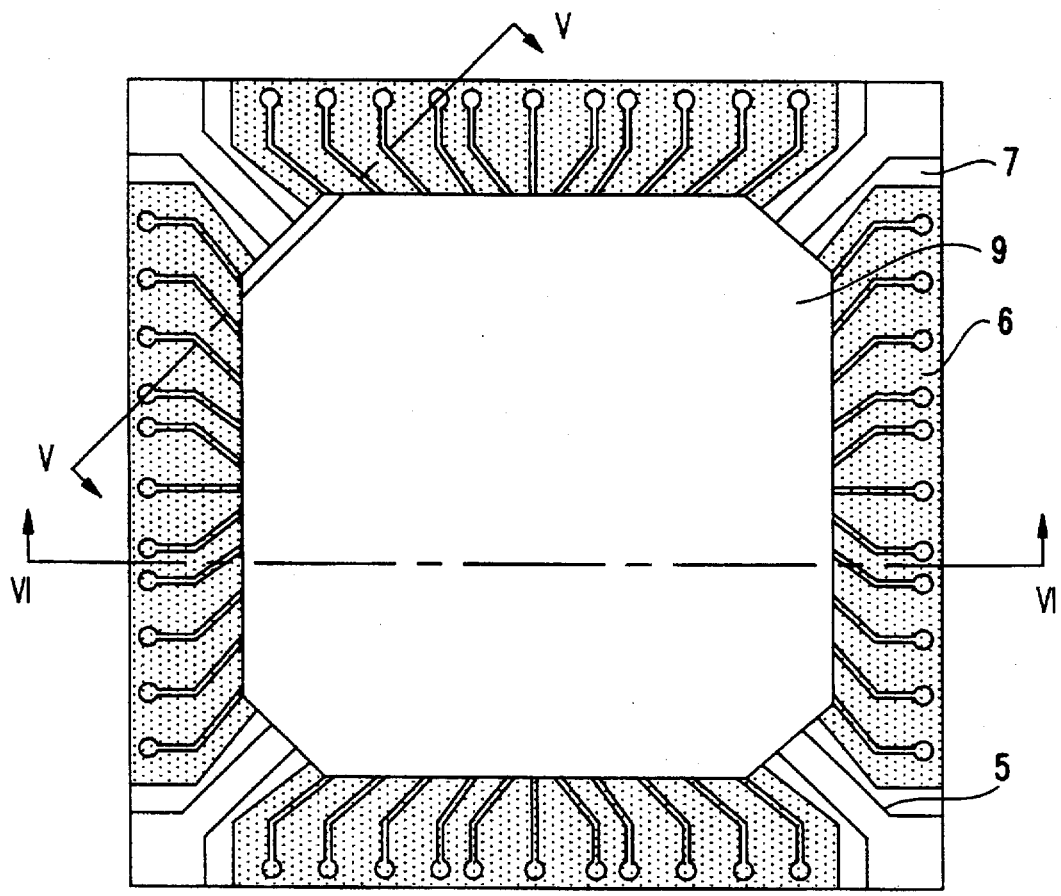
FIG. 4 is a plan view of the second embodiment of the semiconductor device having a ball-grid-array-type package according to the present invention.
Figure 5:
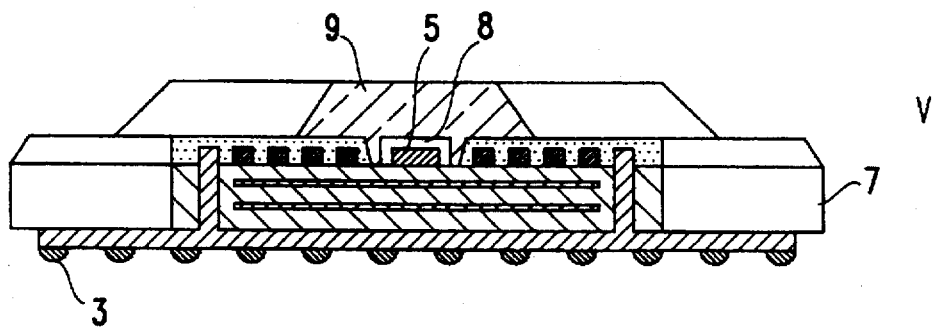
FIG. 5 is a cross-sectional view taken along line V—V of FIG. 4.
Figure 6:
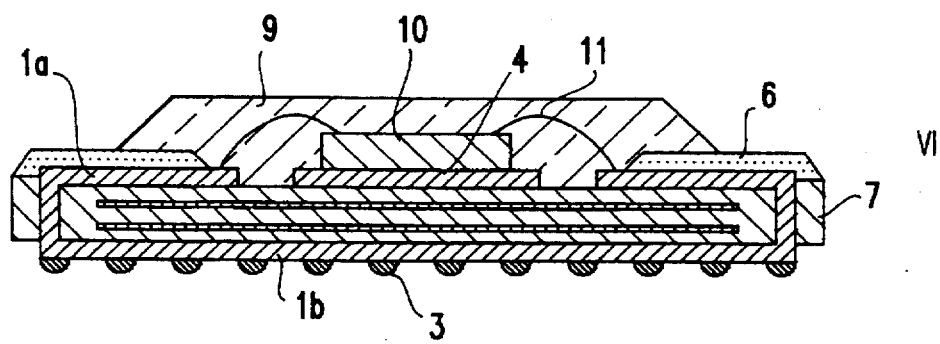
FIG. 6 is a cross-sectional view taken along line VI—VI of FIG. 4.

The semiconductor device shown in FIG. 4 is fabricated as follows: A semiconductor element 10 is mounted on the semiconductor element mounting pad 4 of the wiring substrate shown in FIGS. 2 and 3 by a mount member (not shown). Then, electrodes of the semiconductor element 10 and ends of the upper signal interconnections 1a are connected to each other by thin metal wires 11 such as gold wires or the like. Thereafter, the semiconductor element 10 and the thin metal wires 11 are sealed by a molding resin layer 9 according to the transfer molding process. Finally, solder balls 3 are fused to a pad including the lower signal interconnections 1b on the lower surface of the glass epoxy substrate 7.

In the semiconductor device thus fabricated, the extension patterns 5 connected to the semiconductor element mounting pad 4 serve to dissipate heat generated by the semiconductor element 10 out of the ball-grid-array-type package. Therefore, the heat generated by the semiconductor element 10 is prevented from being confined in the ball-grid-array-type package. The gold layers 8 plated on the extension patterns 5 are relatively weakly bonded to the molding resin layer 9. The interface between the gold layers 8 and the molding resin layer 9 serves as a passage for discharging humidity from within the package when the semiconductor device is mounted on a circuit substrate. Consequently, the glass epoxy substrate 7 and the molding resin layer 9 are prevented from being peeled off each other when the semiconductor device is mounted on a circuit substrate. Any baking process which has heretofore been necessary to bake the ball-grid-array-type package before the installation of the semiconductor device may be dispensed with. Alternatively, the ball-grid-array-type package may be baked by a simpler baking process than the conventional baking process.

In the illustrated embodiment, the four extension patterns 5 extend from the copper foil of the semiconductor element mounting pad 4 to the respective four corners of the glass epoxy substrate 7. However, such construction is not necessary, and the shape and number of the extension patterns 5 may be modified insofar as the extension patterns 5 extend out of the molding resin layer 9. The gold layers 8 plated on the extension patterns 5 may be replaced with covering layers of any of various other metals which will be relatively weakly bonded to the molding resin layer 9.

As described above, since the ball-grid-array-type package according to the present invention has the extension patterns extending from the semiconductor element mounting pad out of the molding resin layer, the ball-grid-array-type package has an increased heat radiation capability. The ball-grid-array-type package also has the passage for discharging humidity from inner portion of the package for preventing the glass epoxy substrate and the molding resin layer from being peeled off each other when the semiconductor device is mounted on a circuit substrate. The glass epoxy substrate and the molding resin layer are effectively prevented from being peeled off each other because the extension patterns are covered with layers which are relatively weakly bonded to the molding resin layer.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A ball-grid-array-type semiconductor device comprising:

an insulating substrate comprising a semiconductor element mounting pad on an upper surface;

a semiconductor element mounted on said semiconductor element mounting pad, said semiconductor element comprising a plurality of electrodes;

upper signal interconnections positioned on said upper surface of the insulating substrate and connected to said electrodes by metal wires;

lower signal interconnections positioned on a lower surface of the insulating substrate, opposite to said upper surface;

lower signal interconnections positioned on said lower surface and connected to said upper signal interconnections by via-holes in said insulating substrate;

a plurality of balls connected to said lower signal interconnections;

a molding resin layer sealing said semiconductor element; and a plurality of extension patterns disposed on said upper surface and extending from said semiconductor element mounting pad out of said molding resin layer for dissipating heat and humidity thereform.

2. A ball-grid-array-type semiconductor device according to claim 1, wherein said insulating substrate comprises a glass epoxy substrate, each of said upper signal interconnections, said lower second signal interconnections, said semiconductor element mounting pad, and said extension patterns comprising a copper foil pattern.

3. A ball-grid-array-type semiconductor device according to claim 1, wherein each of said extension patterns is covered with a metal layer which is relatively weakly bonded to said molding resin layer.

4. A ball-grid-array-type semiconductor device according to claim 3, wherein said metal layer comprises a plated gold layer.

5. A ball-grid-array-type semiconductor device according to claim 3 wherein said metal layer weakly bonded to said molding resin layer provides a passage for humidity to escape.

6. A ball-grid-array-type semiconductor device according to claim 1, wherein said upper signal interconnections are covered with a solder resist layer, and said extension patterns of said semiconductor element mounting pad are free of a solder resist layer.

7. A ball-grid-array-type semiconductor device according to claim 1, wherein said extension patterns extend from respective corners of said semiconductor element mounting pad toward respective corners of said insulating substrate.

8. A heat and humidity dissipating semiconductor chip mounting device, comprising:

an insulating substrate;

a multi-sided central mounting pad on a top side of said insulating substrate for receiving a semiconductor chip;

a plurality of heat dissipating extensions extending from said multi-sided central mounting pad; and a resin layer for encapsulating the semiconductor chip in said chip mounting device, said plurality of heat dissipating extensions being bonded to said resin layer to provide a passage for humidity to escape from said chip mounting device.

9. A heat and humidity dissipating semiconductor chip mounting device as recited in claim 8, further comprising:

a plurality of vias positioned about a periphery of said insulating substrate;

a plurality of upper signal interconnections extending outwardly from each side of said multi-sided central mounting pad to said plurality of vias; and a plurality of lower signal interconnections positioned on a bottom side of said insulating substrate connected to respective ones of said upper signal interconnections through said plurality of vias.

10. A heat and humidity dissipating semiconductor chip mounting device as recited in claim 8, wherein said multi-sided central mounting pad and said plurality of heat dissipating extensions comprise a continuous element.

11. A heat humidity dissipating semiconductor chip mounting device as recited in claim 8, wherein said central mounting pad and said plurality of heat dissipating extensions comprises copper foil.

12. A heat and humidity dissipating semiconductor chip mounting device as recited in claim 8, wherein said plurality of heat dissipating extensions are gold plated.

13. A heat and humidity dissipating semiconductor chip mounting device as recited in claim 8 further comprising a solder resist layer between said insulating substrate and said plurality of upper signal interconnections.

14. A heat and humidity dissipating semiconductor chip mounting device as recited in claim 8 further comprising a solder resist layer between said insulating substrate and said plurality of lower signal interconnections.

15. A heat and humidity dissipating semiconductor chip mounting device as recited in claim 8 wherein said substrate comprises an epoxy substrate.

16. A heat and humidity dissipating semiconductor chip mounting device as recited in claim 8 further comprising solder balls connected to said plurality of lower signal interconnections.

17. A heat and humidity dissipating semiconductor chip mounting device as recited in claim 8 wherein said multi-sided central mounting pad comprises four sides.

18. A heat and humidity dissipating semiconductor chip mounting device as recited in claim 17 wherein said plurality of heat dissipating extensions extend from a corner of each of said four sides.

19. A heat and humidity dissipating semiconductor chip mounting device as recited in claim 8 wherein said multi-sided central mounting pad comprises a square shape.

20. A heat and humidity dissipating semiconductor chip mounting device as recited in claim 18 wherein said plurality of heat dissipating extensions extend from corners of said square shape.

* * * * *